United States Patent
Sekiguchi et al.

(10) Patent No.: US 8,862,083 B2
(45) Date of Patent: Oct. 14, 2014

(54) TUNING CIRCUIT

(71) Applicant: Semiconductor Components Industries, LLC, Phoenix, AZ (US)

(72) Inventors: Satoru Sekiguchi, Saitama-ken (JP); Shinya Inaba, Gunma-ken (JP); Toru Odajima, Gunma-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/909,143

(22) Filed: Jun. 4, 2013

(65) Prior Publication Data

US 2013/0324067 A1    Dec. 5, 2013

(30) Foreign Application Priority Data

Jun. 4, 2012    (JP) ................................. 2012-127403

(51) Int. Cl.
*H04B 1/26* (2006.01)
*H04B 1/18* (2006.01)
*H04B 1/16* (2006.01)

(52) U.S. Cl.
CPC ........................................ *H04B 1/16* (2013.01)
USPC ...................... 455/197.2; 455/179.1; 455/257

(58) Field of Classification Search
USPC .......... 455/150.1, 170.1, 179.1, 196.1, 197.1, 455/197.2, 255, 257, 258, 260
See application file for complete search history.

(56) References Cited

U.S. PATENT DOCUMENTS

| 4,847,572 | A | * | 7/1989 | Yokoyama | 455/262 |
| 5,428,835 | A | * | 6/1995 | Okanobu | 455/260 |
| 6,021,322 | A | * | 2/2000 | Hatada et al. | 455/193.1 |
| 7,551,906 | B2 | * | 6/2009 | Ikeda et al. | 455/255 |

FOREIGN PATENT DOCUMENTS

JP    09-200067 A    7/1997

OTHER PUBLICATIONS

Patent Abstracts of Japan, Publication No. 09-200067, Published on Jul. 31, 1997, 1 page.

* cited by examiner

*Primary Examiner* — Quochien B Vuong

(57) ABSTRACT

To adjust a tuning frequency without an output being muted while an oscillation frequency is adjusted. A tuning circuit includes a pair of an inductor and a tuning variable capacitor unit, adjusts a tuning frequency by changing a capacitance of the tuning variable capacitor unit, and obtains a tuning signal having a limited band from a received signal. The tuning circuit includes an oscillating inductor that passes a current corresponding to the tuning signal, an oscillating variable capacitor unit that adjusts the oscillation frequency of a system including the oscillating inductor, and a controller that changes a capacitance of the oscillating variable capacitor unit correspondingly to a desired tuning frequency while adjusting the capacitance such that the oscillation frequency corresponds to the desired tuning frequency, and adjusts a capacitance of the tuning variable capacitor unit in accordance with the adjusted capacitance of the oscillating variable capacitor unit.

20 Claims, 1 Drawing Sheet

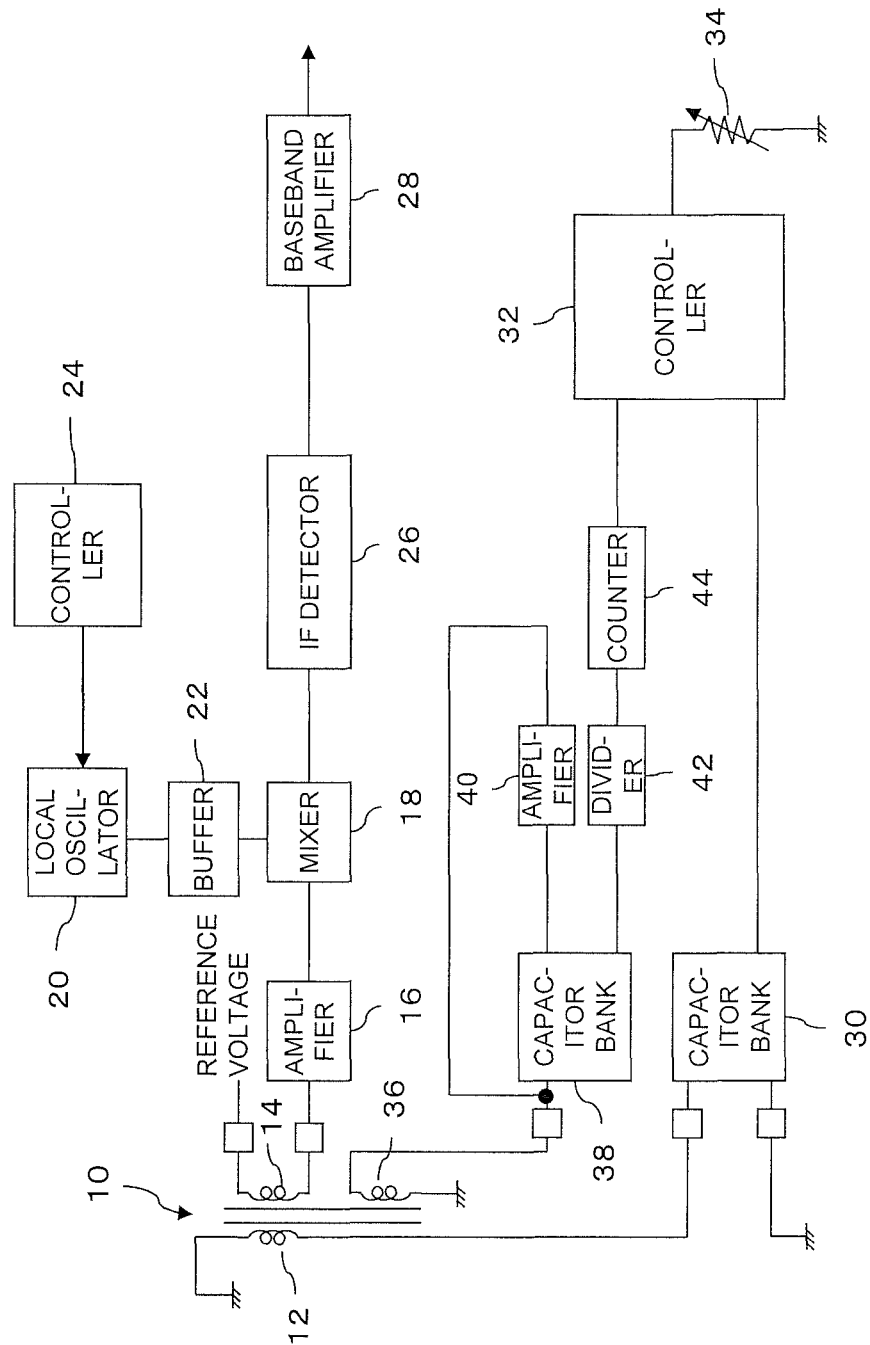

TUNING CIRCUIT

PRIORITY INFORMATION

This application claims priority to Japanese Patent Application No. 2012-127403, filed on Jun. 4, 2012, which is incorporated herein by reference in its entirety.

BACKGROUND

1. Technical Field

The present invention relates to a tuning circuit which adjusts a tuning frequency of a system applying a received signal to an inductor and changing a capacitance of a tuning variable capacitor unit connected to the inductor to obtain a tuning signal at the inductor.

2. Background Art

In an AM radio, a signal has traditionally been supplied from an antenna to an antenna tuning circuit, where a tuning signal centered on a frequency of the desired channel has been extracted. In one tuning circuit, a variable capacitor is manually operated to change the tuning frequency. In this case, the tuning frequency is changed while checking an output sound from a speaker to set the tuning frequency to be the desired one.

On the other hand, digital adjustment of the tuning frequency has increasingly been used, and in this case, the tuning frequency is adjusted by switching capacitor banks to adjust a capacitance depending on a signal for the desired channel frequency. At this time, the capacitor banks are switched to connect the inductor to which a received signal is input in a resonant mode such that a resonant frequency becomes the desired channel frequency. In this case, an oscillation frequency can be adjusted so as to follow the desired channel frequency using a phase-locked loop (PLL), a frequency-locked loop (FLL) and the like.

Since a signal not having a frequency of the desired channel is oscillated when a mode is switched to an oscillation mode to adjust the oscillation frequency, a noise on adjusting a local oscillation frequency (LocalOSC setting noise) or a noise of an antenna tuning signal (ANT tuning noise) is large. Therefore, the output is muted so that a noise from the speaker may not be increased.

Thus, a user cannot adjust the tuning frequency in such a tuning circuit while hearing the sound output from the speaker.

SUMMARY

The present invention provides a tuning circuit which includes a pair of an inductor and a tuning variable capacitor unit, adjusts a tuning frequency by changing a capacitance of the tuning variable capacitor unit, and obtains a tuning signal having a limited band from a received signal. The tuning circuit includes an oscillating inductor that passes a current corresponding to the tuning signal, an oscillating variable capacitor unit that adjusts the oscillation frequency of a system including the oscillating inductor, and a controller that changes a capacitance of the oscillating variable capacitor unit correspondingly to a desired tuning frequency while adjusting the capacitance such that the oscillation frequency corresponds to the desired tuning frequency, and adjusts a capacitance of the tuning variable capacitor unit in accordance with the adjusted capacitance of the oscillating variable capacitor unit.

According to the present invention, a capacitance of the oscillating variable capacitor unit is changed correspondingly to a desired tuning frequency while adjusting the capacitance such that the oscillation frequency corresponds to the desired tuning frequency, and a capacitance of the tuning variable capacitor unit is adjusted in accordance with the adjusted capacitance of the oscillating variable capacitor unit. Therefore, the tuning frequency can be adjusted while adjusting the oscillation frequency, allowing the tuning frequency to be adjusted without an output of the tuning signal being muted.

BRIEF DESCRIPTION OF THE DRAWING

FIG. 1 is a block diagram showing a structure of an embodiment.

DESCRIPTION OF EMBODIMENTS

Hereinafter, an embodiment of the present invention will be described based on the drawing.

FIG. 1 is a block diagram showing a structure of an embodiment. A signal from an antenna is applied to an inductor 12 of a tuning circuit 10. The other end of the antenna is coupled to a ground. The inductor 12 is magnetically coupled via an iron core with an inductor 14, which carries a current corresponding to that flowing in the inductor 12. This current, is supplied via an amplifier 16 to a mixer 18. The other end of the inductor 14 is supplied with a reference voltage.

The mixer 18 is supplied with a local signal from a local oscillator 20 via a buffer 22. Here, an oscillation frequency of the local oscillator 20 is changed by a controller 24. That is, the oscillation frequency is adjusted to a frequency separated from a desired channel frequency by an IF (intermediate frequency: 450 kHz in the AM broadcast, for example).

Accordingly, an IF signal for a signal of the desired channel is obtained at an output of the mixer 18. This IF signal is supplied to an IF detector 26, where the signal is demodulated and converted into a baseband signal. An output from the IF detector 26 is amplified in a predetermined manner in a baseband amplifier 28 and is output as a sound from the speaker. In the case of the AM broadcast, in which signals are amplitude modulated, the IF detector 26 removes a carrier to extract the baseband signal. However, other modulations may be used.

Here, the inductor 12 is coupled with a capacitor bank 30 having a plurality of capacitances therein in the tuning circuit 30. The other end of the capacitor bank 30 is coupled to a ground. Furthermore, the capacitor bank 30 is coupled with a controller 32. The controller 32 controls connection between the plurality of capacitances of the capacitor bank 30 to change the capacitance of the capacitor bank 30 so as to control a tuning frequency of the tuning circuit 10. In other words, this causes the inductor 12 to be coupled to the ground via the capacitor bank 30, so that a resonant frequency of the circuit including the inductor 12 and the capacitor bank 30 is controlled by the capacitance of the capacitor bank 30.

Examples of the capacitor bank 30 may include one in which a plurality of capacitors are connected in parallel and each capacitor is connected with a switch in series, one in which a plurality of capacitors are connected in series and each capacitor is provided with a switch on a bypass thereof, and one which is a combination thereof, the capacitance of which may be changed by controlling on/off of the switch.

Additionally, the controller 32 is connected with a variable resistance 34, which is controlled in response to selection of the desired channel by a user. For example, a resistance value of the variable resistance 34 is changed in response to an operation with a channel selector knob provided to a radio body. A microcomputer, a state machine or the like is used for the controller 32.

Here, the tuning circuit 10 is provided with an inductor 36 which is magnetically coupled with the inductor 12 via the iron core. The inductor 36 is coupled with a capacitor bank 38. The other end of the inductor 36 is couple to a ground.

On the other hand, the other end of the capacitor bank 38 is coupled with an amplifier 40, and an output of the amplifier 40 is coupled to a connecting point between the inductor 36 and the capacitor bank 38. Accordingly, a loop is formed in which the output of the amplifier 40 is fed back to an input side of the capacitor bank 30, which allows the circuit including the inductor 36 and the capacitor bank 38 to actively oscillate, and an oscillation frequency thereof may be controlled at a capacitance value of the capacitor bank 38.

Then, the output of the capacitor bank 38 is also input to a divider 42, divided at a predetermined division ratio in the divider 42, and thereafter input to a counter 44. The counter 44 is a frequency counter which supplies the controller 32 with a counting result about the frequency obtained by counting, for example, one cycle of a signal after frequency division (half cycle and plural cycles may be used). The controller 32 detects the oscillation frequency from the counting result of the counter 44, and controls the capacitance value of the capacitor bank 38 such that the oscillation frequency becomes four times the target desired channel frequency and similarly controls the capacitance value of the capacitor bank 30. The provision of the divider 42 may eliminate the need to make a clock of the counter 44 fast so much even in the case of counting the half cycle.

The frequency of the controller 32 may be detected by other ways such as counting zero crossings within a predetermined time.

This controls the tuning frequency of the tuning circuit 10 to be tuned to the desired frequency input by the variable resistance 34.

Here, an inductance L3 of the inductor 36 is set to a specified fraction of the integer of an inductance L1 of the inductor 12 so that the oscillation frequency of a system including the inductor 36 is made relatively higher than the tuning frequency to eliminate an influence on the tuning signal.

For example, setting of $L3=(1/16)*L1$ allows the oscillation frequency to be set to a value four times the tuning frequency. Here, the resonant frequency of the circuit is $1/2\pi(LC)^{1/2}$.

An AM broadcast frequency band is between 520 kHz and 1710 kHz, and in the case of four times the tuning frequency, the oscillation frequency of the circuit including the inductor 36 is about 2 MHz to 6.8 MHz which is away from the AM broadcast range, eliminating the harmful influence on receiving the AM broadcast. The oscillation frequency may be also set to eight times the tuning frequency, but an error of the tuning frequency which is set according to the oscillation frequency is likely to be larger. Further, a number larger than four and smaller than eight may be used as a factor for the multiple, but the use of a factor of four is easy to understand and the inductor may be easy to manufacture.

The controller 32 detects the user desired channel frequency according to the resistance value of the variable resistance 34, adjusts the capacitances of the capacitor banks 30 and 38, sets the tuning frequency of the tuning circuit 10 to the desired channel frequency, and adjusts the oscillation frequency to four times the tuning frequency.

Note that the inductor 14 may have any inductance so long as it can carry a current corresponding to that flows in the inductor 12. Further, in the above description, the inductor 12 is coupled with the capacitor bank 30, but the inductor 14 may be coupled with the capacitor bank 30 where the tuning frequency may be set. In this way, in the embodiment, the user's operation of a frequency adjusting knob and the like for changing the resistance value of the variable resistance 34 allows to set the target tuning frequency. Ordinarily, the knob is operated in terms of indication of the target tuning frequency. Then, the controller 32 adjusts the capacitance of the capacitor bank 38 to set the oscillation frequency of this circuit to four times the target tuning frequency, and similarly adjusts the capacitance of the capacitor bank 30 in accordance therewith, adjusting the tuning frequency to the target tuning frequency.

In adjusting like this, no mute is carried out and the tuning signal is always output. Therefore, in a system which adjusts the tuning frequency according to the oscillation frequency, the user can adjust the tuning frequency while hearing the output sound which is being adjusted.

Note that the tuning circuit 10 is typically used in a radio receiver for receiving the AM broadcast, but may be used for other broadcasts so long as the tuning circuit 10 is used.

What is claimed is:

1. A tuning circuit obtaining a tuning signal having a limited band from a received signal, comprising:
    a tuning inductor that passes the tuning signal selected from the received signal;
    a tuning variable capacitor unit that adjusts a tuning frequency of a system including the tuning inductor;
    an oscillating inductor that passes an oscillation signal corresponding to the tuning signal;
    an oscillating variable capacitor unit that adjusts an oscillation frequency of a system including the oscillating inductor; and
    a controller that adjusts a capacitance of the oscillating variable capacitor unit such that the oscillation frequency has a value corresponding to a desired tuning frequency and adjusts a capacitance of the tuning variable capacitor unit in accordance with the adjusted capacitance of the oscillating variable capacitor unit.

2. The tuning circuit according to claim 1, wherein the oscillation frequency of the system including the oscillating inductor is an integral multiple of the tuning frequency.

3. The tuning circuit according to claim 2, wherein the integral multiple of the tuning frequency is four times the tuning frequency.

4. The tuning circuit according to claim 3, wherein each of the tuning variable capacitor unit and the oscillating variable capacitor unit is a capacitor bank that has a plurality of unit capacitances and a plurality of switches, the plurality of switches being switched on and off to change the capacitances.

5. The tuning circuit according to claim 4, wherein the tuning variable capacitor unit and the oscillating variable capacitor unit have the same structure.

6. The tuning circuit according to claim 2, wherein each of the tuning variable capacitor unit and the oscillating variable capacitor unit is a capacitor bank that has a plurality of unit capacitances and a plurality of switches, the plurality of switches being switched on and off to change the capacitances.

7. The tuning circuit according to claim 6, wherein the tuning variable capacitor unit and the oscillating variable capacitor unit have the same structure.

8. The tuning circuit according to claim 1, wherein each of the tuning variable capacitor unit and the oscillating variable capacitor unit is a capacitor bank that has a plurality of unit capacitances and a plurality of switches, the plurality of switches being switched on and off to change the capacitances.

9. The tuning circuit according to claim 8, wherein the tuning variable capacitor unit and the oscillating variable capacitor unit have the same structure.

10. A tuning method using a tuning circuit obtaining a tuning signal having a limited band from a received signal, the tuning circuit including:
   a tuning inductor that passes the tuning signal selected from the received signal;
   a tuning variable capacitor unit that adjusts a tuning frequency of a system including the tuning inductor;
   an oscillating inductor that passes an oscillation signal corresponding to the tuning signal;
   an oscillating variable capacitor unit that adjusts an oscillation frequency of a system including the oscillating inductor; and
   a controller that adjusts the oscillating variable capacitor unit and the tuning variable capacitor unit, wherein
   the controller adjusts a capacitance of the oscillating variable capacitor unit such that the oscillation frequency has a value corresponding to a desired tuning frequency and adjusts a capacitance of the tuning variable capacitor unit in accordance with the adjusted capacitance of the oscillating variable capacitor unit.

11. The tuning method according to claim 10, wherein the oscillation frequency of the system including the oscillating inductor is an integral multiple of the tuning frequency.

12. The tuning method according to claim 11, wherein the integral multiple of the tuning frequency is four times the tuning frequency.

13. The tuning method according to claim 12, wherein each of the tuning variable capacitor unit and the oscillating variable capacitor unit is a capacitor bank that has a plurality of unit capacitances and a plurality of switches, the plurality of switches being switched on and off to change the capacitances.

14. The tuning method according to claim 13, wherein the tuning variable capacitor unit and the oscillating variable capacitor unit have the same structure.

15. The tuning method according to claim 11, wherein each of the tuning variable capacitor unit and the oscillating variable capacitor unit is a capacitor bank that has a plurality of unit capacitances and a plurality of switches, the plurality of switches being switched on and off to change the capacitances.

16. The tuning method according to claim 15, wherein the tuning variable capacitor unit and the oscillating variable capacitor unit have the same structure.

17. The tuning method according to claim 10, wherein each of the tuning variable capacitor unit and the oscillating variable capacitor unit is a capacitor bank that has a plurality of unit capacitances and a plurality of switches, the plurality of switches being switched on and off to change the capacitances.

18. The tuning method according to claim 17, wherein the tuning variable capacitor unit and the oscillating variable capacitor unit have the same structure.

19. A radio receiver, comprising:
   a tuning circuit obtaining a tuning signal having a limited band from a received signal, including:
      a tuning inductor that passes the tuning signal selected from the received signal;
      a tuning variable capacitor unit that adjusts a tuning frequency of a system including the tuning inductor;
      an oscillating inductor that passes an oscillation signal corresponding to the tuning signal;
      an oscillating variable capacitor unit that adjusts an oscillation frequency of a system including the oscillating inductor; and
      a controller that adjusts a capacitance of the oscillating variable capacitor unit such that the oscillation frequency has a value corresponding to a desired tuning frequency and adjusts a capacitance of the tuning variable capacitor unit in accordance with the adjusted capacitance of the oscillating variable capacitor unit,
   a mixer that gets an IF signal from the tuning signal;
   an IF detector that gets a baseband signal from the IF signal; and
   a baseband amplifier that amplifies the baseband signal.

20. The radio receiver according to claim 19, wherein the oscillation frequency of the system including the oscillating inductor is an integral multiple of the tuning frequency.

* * * * *